(12) United States Patent
Clark

(10) Patent No.: US 12,372,871 B2
(45) Date of Patent: Jul. 29, 2025

(54) EUV ACTIVE FILMS FOR EUV LITHOGRAPHY

(71) Applicant: Tokyo Electron Limited, Tokyo (JP)

(72) Inventor: Robert Clark, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 699 days.

(21) Appl. No.: 17/522,563

(22) Filed: Nov. 9, 2021

(65) Prior Publication Data

US 2023/0143629 A1 May 11, 2023

(51) Int. Cl.
G03F 7/004 (2006.01)
G03F 7/16 (2006.01)
G03F 7/20 (2006.01)
G03F 7/40 (2006.01)

(52) U.S. Cl.
CPC .......... *G03F 7/2004* (2013.01); *G03F 7/0042* (2013.01); *G03F 7/162* (2013.01); *G03F 7/40* (2013.01)

(58) Field of Classification Search
CPC ..... G03F 7/0042; G03F 7/0043; G03F 7/0044
See application file for complete search history.

(56) References Cited

U.S. PATENT DOCUMENTS

| | | | |
|---|---|---|---|
| 4,935,312 A | 6/1990 | Nakayama | |
| 6,794,288 B1 | 9/2004 | Kolics | |
| 6,902,605 B2 | 6/2005 | Kolics | |
| 6,911,067 B2 | 6/2005 | Kolics | |
| 8,465,903 B2 | 6/2013 | Weidman et al. | |
| 8,536,068 B2 | 9/2013 | Weidman et al. | |
| 9,778,561 B2 | 10/2017 | Marks et al. | |
| 9,829,805 B2 | 11/2017 | Michaelson et al. | |
| 9,996,004 B2 | 6/2018 | Smith et al. | |
| 10,514,598 B2 | 12/2019 | Marks et al. | |
| 10,727,075 B2 | 7/2020 | Kim et al. | |
| 10,732,505 B1 | 8/2020 | Meyers et al. | |
| 10,831,096 B2 | 11/2020 | Marks et al. | |
| 2006/0292491 A1 | 12/2006 | Chung et al. | |
| 2015/0221519 A1 | 8/2015 | Marks et al. | |
| 2016/0116839 A1 | 4/2016 | Meyers | |
| 2017/0102612 A1 | 4/2017 | Meyers et al. | |
| 2018/0004083 A1 | 1/2018 | Marks et al. | |
| 2019/0212656 A1 | 7/2019 | Dai et al. | |
| 2021/0013034 A1 | 1/2021 | Wu et al. | |
| 2021/0242019 A1 | 8/2021 | Smith et al. | |

FOREIGN PATENT DOCUMENTS

| | | |
|---|---|---|
| TW | 202006168 A | 2/2020 |
| WO | 2019217749 A1 | 11/2019 |
| WO | 2020172481 A1 | 8/2020 |
| WO | 2021072042 A1 | 4/2021 |
| WO | 2021146138 A1 | 7/2021 |

OTHER PUBLICATIONS

Cardineau et al., "EUV Resists based on Tin-Oxo Clusters", Advances in Patterning Materials and Processes XXXI, Proc. of SPIE vol. 9051 90511B-1, downloaded from http://proceedings.spiedigitallibrary.org/ on May 20, 2015, 12 pages.
Hinsberg et al., "A Numberic Model for the Imaging Mechanism of Metal Oxide EUV Resists", Inpria Corp., Columbia Hill Techincal Consulting, EUVL Workshop 2018, 21 pages.
Ober et al., "EUV Photolithography: Resist Progress and Challenges", Proc. of SPIE vol. 10583, 1058306-1, downloaded from http://spiedigitallibrary.org/confernece-proceedings-of-spie on Sep. 15, 2021, 14 pages.
International Search Report and Written Opinion, PCT Application No. PCT/US2022/049146, mailed Mar. 17, 2023, 11 pages.
Grenville, Andrew et al., "Integrated Fab Process for Metal Oxide EUV Photoresist," Proceedings of SPIE—The International Society for Optical Engineering · Feb. 2015, 9425, 94250S, 9 pages.
Volosskiy, Boris et al., U.S. Appl. No. 62/782,578, filed Dec. 20, 2018, entitled "Dry Development of EUV Photoresists," , 45 pages.

*Primary Examiner* — Daborah Chacko-Davis
(74) *Attorney, Agent, or Firm* — Slater Matsil, LLP

(57) ABSTRACT

A method of processing a substrate that includes forming over the substrate an extreme ultraviolet (EUV)-active photoresist film including a network of metal oxide terminated with alkoxy groups and patterning the EUV-active photoresist film with EUV lithography.

20 Claims, 10 Drawing Sheets

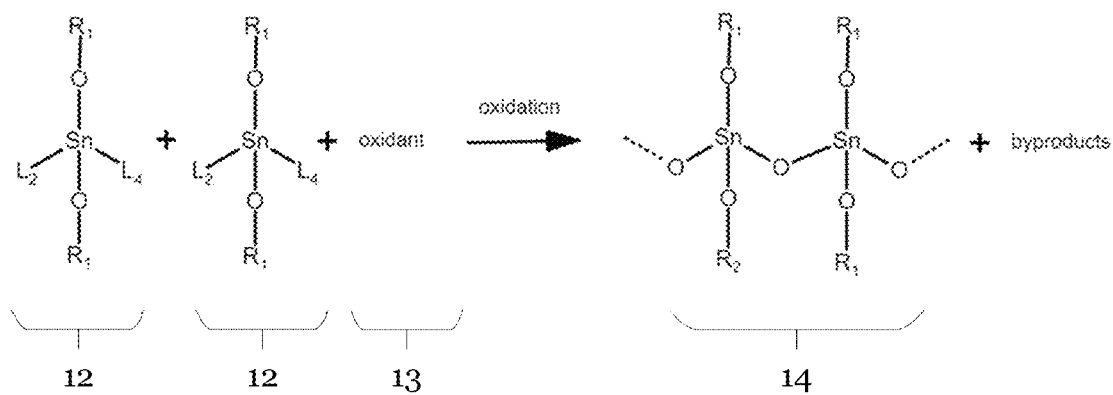
FIG. 3
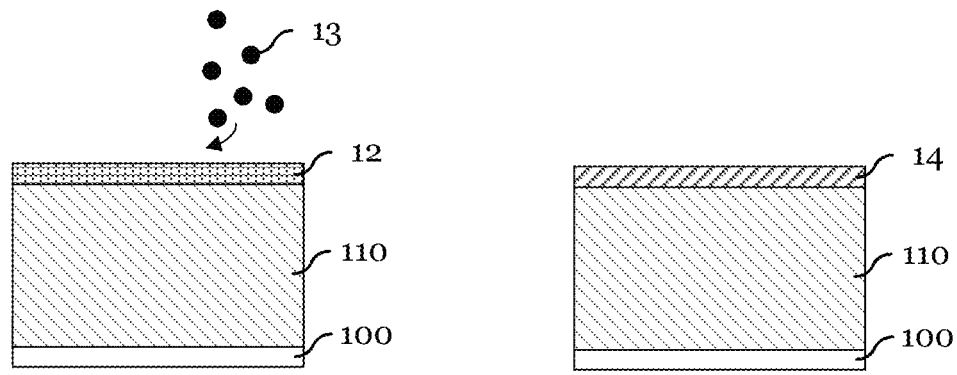
FIG. 4A
FIG. 4B
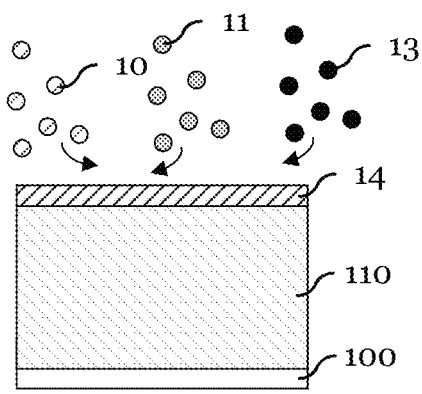
FIG. 4C

EUV ACTIVE FILMS FOR EUV LITHOGRAPHY

TECHNICAL FIELD

The present invention relates generally to extreme ultraviolet (EUV) lithography, and, in particular embodiments, to EUV active films and methods of formation thereof.

BACKGROUND

Generally, a semiconductor device, such as an integrated circuit (IC) is fabricated by sequentially depositing and patterning layers of dielectric, conductive, and semiconductor materials over a semiconductor substrate to form a network of electronic components and interconnect elements (e.g., transistors, resistors, capacitors, metal lines, contacts, and vias) integrated in a monolithic structure. At each successive technology node, the minimum feature sizes are shrunk to reduce cost by roughly doubling the component packing density.

A common patterning method is to use a photolithography process to expose a coating of photoresist over the target layer to a pattern of actinic radiation and then transfer the relief pattern to the target layer or an underlying hard mask layer formed over the target layer. With this technique, the minimum feature size would be limited by the resolution of the optical system. Accordingly, scaling of feature sizes for the 7 nm and 5 nm technology nodes may need 13.5 nm extreme ultraviolet (EUV) lithography. Innovations on EUV photolithographic techniques may be needed to satisfy the cost and quality requirements for patterning at the sub-10 nm node regime.

SUMMARY

In accordance with an embodiment of the present invention, a method of processing a substrate that includes forming over the substrate an extreme ultraviolet (EUV)-active photoresist film including a network of metal oxide terminated with alkoxy groups and patterning the EUV-active photoresist film with EUV lithography.

In accordance with an embodiment of the present invention, a method of processing a substrate in a plasma processing chamber, the method including: exposing the substrate in the plasma processing chamber to a first vapor including a EUV metal precursor; exposing the substrate in the plasma processing chamber to a second vapor including an alcohol having a hydrogen in a β-position relative to oxygen; forming a photoresist film including a EUV metal alkoxide over the substrate by exposing the substrate in the plasma processing chamber to a third vapor including an oxidant; and patterning the photoresist film with EUV lithography.

In accordance with an embodiment of the present invention, a method of extreme ultraviolet (EUV) lithography that includes: forming a EUV-active photoresist layer over a substrate, the EUV-active photoresist layer including a network of tin oxide terminated with alkoxy groups; exposing the substrate to a EUV irradiation having passed through an optical mask that includes patterns to form exposed regions of the EUV-active photoresist layer, one or more alkoxy groups in the exposed regions undergoing β-hydrogen elimination to form a tin hydroxide by eliminating an alkene; and developing the EUV-active photoresist layer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A and 2B illustrate cross-sectional views of a substrate during two-step formation of a tin alkoxide in accordance with an embodiment, wherein FIG. 2A illustrates the substrate at deposition of a tin precursor.

FIG. 3 illustrates an oxidation of a tin alkoxide to form an extreme ultraviolet (EUV)-active photoresist in accordance with various embodiments;

FIGS. 4A and 4B illustrate cross-sectional views of a substrate during an oxidation step of a tin alkoxide in accordance with an embodiment, wherein FIG. 4A illustrates the substrate at deposition of an oxidant, and FIG. 4B illustrates the substrate at the completion of forming an EUV-active photoresist layer;

FIG. 4C illustrates a cross-sectional view of a substrate during one-step formation of an EUV-active photoresist layer in accordance with an alternate embodiment;

FIGS. 5A-5C illustrate example chemical structures of EUV-active photoresist comprising alkoxy groups in accordance with various embodiments, wherein FIG. 5A illustrates an ethoxide, FIG. 5B illustrates a tert-butoxide, and FIG. 5C illustrates a cyclohexyl alkoxide;

FIGS. 6A and 6B illustrate process flow charts of methods of formation of a EUV-active photoresist layer in accordance with various embodiments, wherein FIG. 6A illustrates some embodiment process flows, and FIG. 6B illustrates alternate embodiment process flows;

FIGS. 8A and 8B illustrate cross-sectional views of a substrate at an EUV irradiation step in a EUV lithography process in accordance with various embodiments, wherein FIG. 8A illustrates the substrate at the start of the EUV irradiation, and FIG. 8B illustrates the substrate after the EUV irradiation;

FIGS. 11A and 11B illustrate cross sectional views of a substrate after a developing step in accordance with various embodiments, wherein FIG. 11A illustrates the substrate in accordance with an embodiment without a PEB, and FIG. 11B illustrates the substrate in accordance with an alternate embodiment with the PEB;

FIGS. 12A and 12B illustrate cross-sectional views of a substrate at various intermediate stages of a EUV lithography process in accordance with alternate embodiments, wherein FIG. 12A illustrates the substrate after an EUV irradiation step and a deposition step to form a material layer, and FIG. 12B illustrates the substrate after a developing step;

FIGS. 12C and 12D illustrate cross-sectional views of a substrate at various intermediate stages of a EUV lithography process in accordance with yet other embodiments, wherein FIG. 12C illustrates the substrate after an EUV irradiation step, a post-exposure deposition step to form a material layer, and a PEB, and FIG. 12D illustrates the substrate after a developing step.

DETAILED DESCRIPTION OF ILLUSTRATIVE EMBODIMENTS

Figure 1:
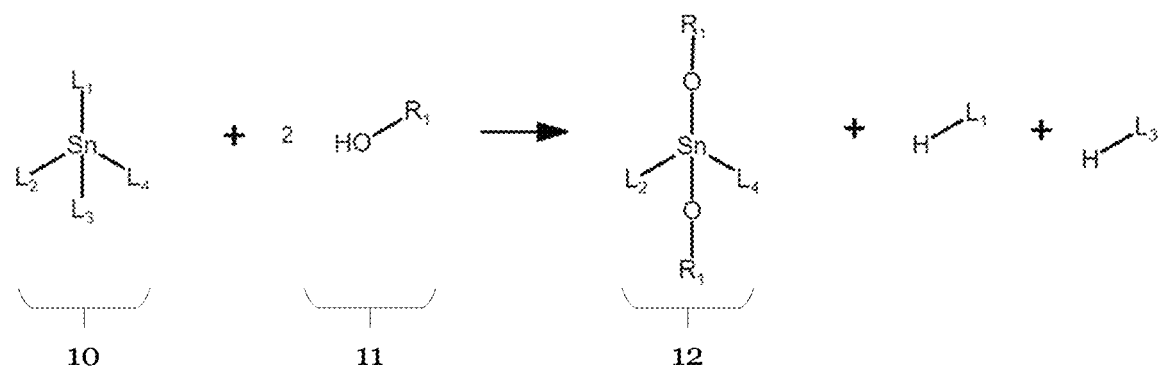
FIG. 1 illustrates a reaction of a tin precursor and alcohol to form a tin alkoxide in accordance with various embodiments.

This application relates to a method of photolithographic process, more particularly to a method of forming an extreme ultraviolet (EUV)-active photoresist comprising a metal alkoxide moiety for EUV photolithographic processes. EUV lithography techniques, for example using a UV wavelength of 13.5 nm, may offer significant advantages in patterning sub-10 nm features with its high optical resolution. However, one major engineering challenge for EUV lithography is that photoresists developed for conventional photolithography systems may not be sufficiently effective. For example, chemically amplified resist (CAR) or similar polymer resists commonly used in 193 nm lithography tend to have low absorption coefficients at 13.5 nm and thus may suffer a poor sensitivity. Further, the diffusion of photo-activated species in CAR may cause blurring and increase in line-edge roughness. Therefore, developing a new class of photoresists for EUV lithography with better performance may be desired. Embodiments of the present application disclose methods of forming an EUV-active photoresist layer comprising a metal alkoxide, in particular a network of metal oxide terminated with alkoxy groups. The alkoxide groups of the metal alkoxide in various embodiments responds to an EUV exposure, inducing changes of material properties. The EUV-active photoresists in various embodiments may be designed based on this EUV-active feature of the metal alkoxide groups.

The methods described in this disclosure may advantageously enable a metal alkoxide-containing extreme ultraviolet (EUV)-active photoresist having a higher EUV absorbance and thereby better resist sensitivity compared to conventional chemically amplified resists (CAR). The higher EUV absorbance may enable decreasing the thickness of the photoresist required for an acceptable performance. The metal alkoxide-containing EUV-active photoresist described in this disclosure may also advantageously exhibit an etch resistance better than conventional CAR. In addition, the methods herein may enable a uniform chemical composition of the metal alkoxide-containing EUV-active photoresist, which may be beneficial in mitigating issues of blur or line edge roughness. Further, the EUV-active photoresist in accordance with various embodiments of this disclosure may be formed over a substrate and developed by dry or wet processes. While conventional techniques used to apply and develop CAR are based on wet processes, dry processes for the formation and developing of the EUV-active photoresist may allow better process control at the nanoscale than a wet process, e.g., for forming features that are a few nanometers or sub-nanometer in critical dimension. Conventional spin-on processes for deposition and wet processes using developing solutions are also available for the methods of this disclosure.

EUV-active photoresists formed by the methods described in this disclosure are based on a network of metal oxide terminated with alkoxy groups (i.e., metal-oxygen-metal bonds and metal-oxygen-carbon bonds), which may advantageously have less toxicity and less environmental concerns, for example, compared to organometallic compounds having metal-carbon bonds.

Figure 5A:
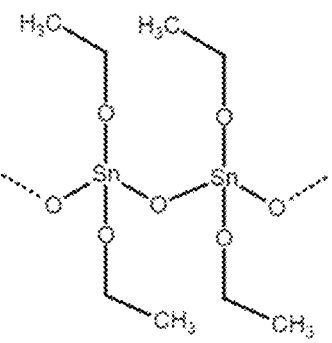
Figure 5B:
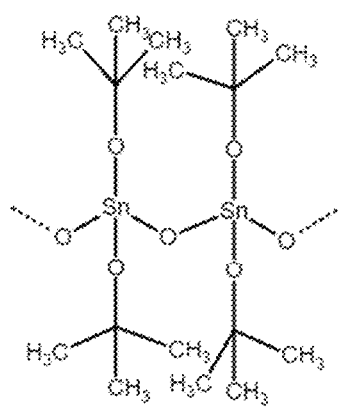
Figure 5C:
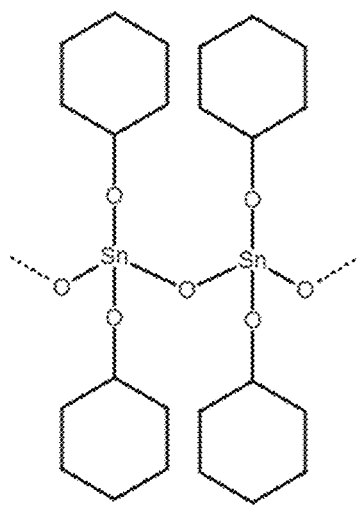

Various embodiments of this disclosure may be comprised of three processing stages: (i) the formation of a metal alkoxide molecule, (ii) the formation of an EUV-active photoresist layer on a substrate, and (iii) an EUV lithography process using the EUV-active photoresist layer. In the following, the stage (i) is first described referring to FIGS. 1 and 2A-2D, the stage (ii) is described next referring to FIGS. 3 and 4A-4B. Examples of chemical structure of the EUV-active photoresist are illustrated in FIGS. 5A-5C. Process flow diagrams for the stages (i) and (ii) in accordance with various embodiments are described in FIGS. 6A and 6B. The stage (iii), i.e., the EUV lithography process, may comprise an EUV irradiation step, an optional post-exposure bake (PEB), and a developing step. They are described referring to FIGS. 7 and 8A-8B, FIGS. 9 and 10, and FIGS. 11A and 11B, respectively. Further, certain embodiments with a post-exposure deposition step to form a material layer are described in FIGS. 12A-12D. An exemplary process flow diagram for the EUV lithography process is described referring to FIG. 13. All figures are drawn for illustration purpose only and not to scale.

FIG. 1 illustrates a reaction of a metal precursor 10 and alcohol 11 to form a metal alkoxide 12 in accordance with various embodiments.

To form a EUV-active photoresist, a metal precursor comprising a EUV metal may be used. In this disclosure, EUV metal may refer to a metal with a high EUV absorption coefficient. In various embodiments, the EUV metal may comprise tin (Sn), and in other embodiments zirconium (Zr), indium (In), antimony (Sb), bismuth (Bi), or hafnium (Hf). In the following, various embodiments including figures are described using tin as an exemplary metal component for the EUV-active photoresist, although in some embodiments other metals may also be present in the EUV-active photoresist.

In FIG. 1, the metal precursor 10, in one illustration, may be an organic tin compound comprising ligands ($L_1$-$L_4$). In various embodiments, these ligands may comprise an amine, carboxylate, or halogen. In some embodiments, some ligands may already comprise an alkoxy group. The alcohol 11 reacts with the metal precursor 10 and replaces one or more of the ligands to form one or more alkoxy groups attached to the metal, i.e., in this case tin. Thus forming a metal alkoxide 12, i.e., in this case tin alkoxide. In this disclosure, the metal alkoxide 12 may refer to a metal compound that comprises a metal atom terminated with one or more alkoxy groups. The metal alkoxide 12 may be used as an intermediate to form an EUV-active photoresist comprising a network of metal oxide terminated with alkoxy groups. In FIG. 1, for example, two ligands (i.e., L1 and L3) are exchanged with two alkoxy groups. Although not wishing to be limited by any theory, some of the functional groups of the metal alkoxide 12 may be reacted and eliminated, for example by moisture. In various embodiments, one or two alkoxy groups per metal atom may be retained to form an EUV-active photoresist. The degree of ligand exchange may depend on process types and conditions. This ligand exchange reaction for the formation of the metal alkoxide 12 may be performed by a dry or wet process. For example, the ligand-exchange reaction may be performed on a substrate by using deposition techniques such as vapor deposition including atomic layer deposition (ALD), chemical vapor deposition (CVD), physical vapor deposition (PVD), as well as other plasma processes such as plasma enhanced CVD (PECVD), and other processes. In other embodiments, a wet process such as a spin-on process may be used.

In various embodiments, the metal alkoxide 12 may comprise an ethoxide, an iso-propoxide, a tert-butoxide, a cyclohexyl alkoxide, a cyclohexene alkoxide, or a cyclohexadiene alkoxide. The metal alkoxide 12 comprises a hydrogen at a β-position (i.e., β-hydrogen) relative to the oxygen atom of the alkoxy group. The β-hydrogen may be an important photo-reactive species in EUV lithography. Although not wishing to be limited by any theory, this may be because the β-hydrogen is necessary for a photo-induced β-hydrogen elimination reaction to occur, which may be the basis for the EUV-active feature of the photoresist in accordance with various embodiments.

The alcohol 11 may be selected accordingly to the type of desired metal alkoxide. For example, the alcohol 11 may comprise ethanol, iso-propanol, tert-butanol, or cyclohexanol. In various embodiments, any alcohol having a hydrogen at a β-position relative to its oxygen atom may be used. In certain embodiments, selecting a bulky alkoxy group may advantageously provide steric hindrance to each other and prevent excess condensation before a EUV lithography process. In addition, a greater number of hydrogen atoms in the alcohol 11 at β-position relative to its oxygen may improve the probability of β-hydrogen elimination and thereby EUV sensitivity. Further, in some embodiments, more than one type of alkoxide may be used to form the EUV-active photoresist. Using more than one type of alkoxide may advantageously allow fine tuning the overall physical and chemical properties (e.g., the bulkiness, carbon-to-oxygen ratio, and/or hydrophobicity/hydrophilicity) of the resulting EUV-active photoresist. In one embodiment, exposure to moisture (water molecules in the gas phase) may also be performed to tune the physical and chemical properties of the EUV-active photoresist.

Figure 2A:
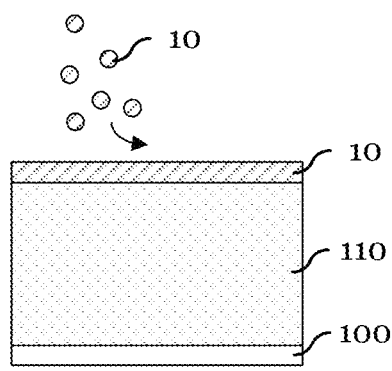
Figure 2B:
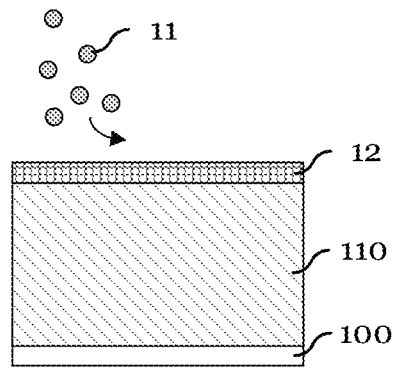

FIGS. 2A and 2B illustrate cross-sectional views of a substrate 100 during two-step formation of the metal alkoxide 12 in accordance with an embodiment.

In FIG. 2A, the substrate 100 comprises a semiconductor substrate in various embodiments. In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. The substrate 100 may comprise an intermediate layer 110 over the substrate 100 as illustrated in FIG. 2A. In certain embodiments, the intermediate layer 110 may comprise silicon oxide, silicon nitride, silicon carbonitride (SiCN), silicon oxycarbide (SiOC), or other materials. The intermediate layer 110 may be the layer to be patterned by an etch process following the EUV lithography process.

In various embodiments, prior to depositing the metal precursor 10, the substrate 100 may optionally be processed by a pretreatment step to improve the deposition step. In some embodiments, a plasma process or a thermal process may be performed to chemically or physically modify the composition of surface terminal groups of the intermediate layer 110. For example, the optional pretreatment may be a plasma treatment using a hydrogen-containing reducing agent. In one embodiment, a plasma treatment using molecular hydrogen ($H_2$) may be performed.

Still referring to FIG. 2A, the metal precursor 10 may be deposited as a layer over the intermediate layer 110 by a dry or wet process. In certain embodiments, although not wishing to be limited by any theory, a portion of the metal precursor 10 may be chemically bonded to the surface of the intermediate layer 110. For example, one of the ligands ($L_1$-$L_4$) of the metal precursor 10 may be reacted with a surface hydroxy group of the intermediate layer 110.

In FIG. 2B, in a subsequent step, the alcohol 11 is supplied from a vapor or a solution to the substrate 100 to react with the absorbed metal precursor 10 to form the metal alkoxide 12, as also shown in FIG. 1. The method in accordance with this embodiment may be particularly advantageous when applied in atomic layer deposition (ALD), enabling layer-by-layer growth of the metal alkoxide 12 with a high uniformity.

Further, in certain embodiments, in order to enable the layer-by-layer growth for precise film thickness control and film uniformity, the above two steps (i.e., the deposition of the metal precursor 10 and the reaction with the alcohol 11) may be sequentially repeated by alternating the exposures to the metal precursor 10 and the alcohol 11. In one embodiment, the two exposures may be partially overlapped in time, although in other embodiments they may not be overlapped and a purge or degassing step may be inserted between the exposure steps. The purge or degassing step may be beneficial to ensure the chemical reactions are limited on surface, while overlapping the exposures may help faster film growth.

In certain embodiments, the thickness of the layer of the metal alkoxide 12 may be between about 15 nm to about 40 nm. Generally, the metal-alkoxide containing EUV photoresist film may advantageously be thinner than conventional CAR due to its higher etch resistance and more sensitivity.

Figure 2C:
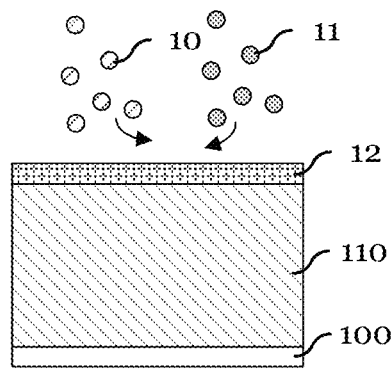
FIG. 2C illustrates a cross-sectional view of a substrate during one-step formation of a tin alkoxide in accordance with an alternate embodiment.

FIG. 2C illustrates a cross-sectional view of a substrate 100 during one-step formation of the metal alkoxide 12 in accordance with an alternate embodiment.

In this alternate embodiment of FIG. 2C, the metal precursor 10 and the alcohol 11 may be supplied from vapors or solutions to the substrate 100 simultaneously in a single step, and the metal alkoxide 12 may be formed and deposited over the intermediate layer 110. Such an embodiment may be advantageous when applied, for example, in chemical vapor deposition (CVD) or plasma enhanced CVD (PECVD), allowing the continuous growth of the layer of the metal alkoxide 12 in the single step.

Figure 2D:
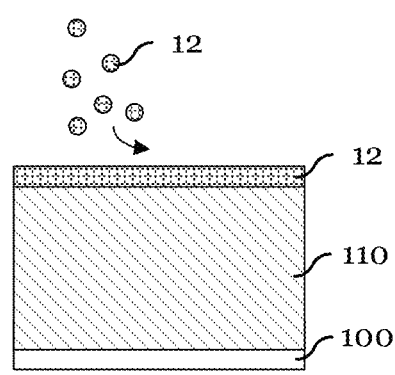
FIG. 2D illustrates a cross-sectional view of a substrate during deposition of a pre-formed tin alkoxide in accordance with another embodiment.

FIG. 2D illustrates a cross-sectional view of a substrate 100 during deposition of a pre-formed metal alkoxide 12 in accordance with another embodiment.

The metal alkoxide 12 may already be prepared in a separate process or available, and may be used in this embodiment, where the metal alkoxide 12 may be directly supplied from a vapor or a solution to the substrate to form a layer over the intermediate layer 110 as illustrated in FIG. 2D.

Although FIGS. 2A-2D illustrate the deposition as only a two-step or single-step process, in various embodiments, the formation of the layer of metal alkoxide 12 may be performed by repeating any of the above process to achieve the desired thickness of the layer.

FIG. 3 illustrates an oxidation of a metal alkoxide 12 to form an extreme ultraviolet (EUV)-active photoresist 14 in accordance with various embodiments.

FIGS. 4A-4B illustrate cross-sectional views of a substrate 100 during an oxidation step described in FIG. 3 in accordance with an embodiment.

The oxidation of the metal alkoxide 12 leads to the formation of metal-oxygen-metal bonds by replacing one or more of the ligands of the metal alkoxide 12, and a condensed network of tin oxide terminated with alkoxy groups is formed. In FIG. 3, by the oxidation, the ligands $L_2$ and $L_4$ of the metal alkoxide 12 are removed as byproducts. This resulting condensed network of metal oxide terminated with alkoxy groups may function as the EUV-active photoresist 14 as further described below. Unlike the previously known tin-based photoresists, the EUV-active photoresist 14 does not comprise a metal-carbon bond. Advantageously, metal alkoxides such as tin alkoxide are generally less toxic and less concerns regarding environmental issues during production.

In various embodiments, an oxidant 13 may be used for the oxidation. In certain embodiments, the oxidant 13 may comprise dioxygen ($O_2$), ozone ($O_3$), water, air, or hydrogen peroxide ($H_2O_2$). Although two alkoxy groups are illustrated for each metal atom in FIG. 3, a metal atom may be bonded to one, two, or three alkoxy groups depending on the structure of the metal alkoxide 12 and the degree of the oxidation.

In certain embodiments, a plasma process in a plasma processing chamber may be employed for the oxidation. In one embodiment, the oxidation may be performed by exposing the metal alkoxide 12 to oxygen radicals generated to form the network of metal oxide.

In FIG. 4A, the oxidant 13 may be supplied from a vapor or a solution to induce the oxidation of the metal alkoxide 12. Consequently, as illustrated in FIG. 4B, a layer of the EUV-active photoresist 14 is formed over the intermediate layer 110 as a result of the oxidation of the metal alkoxide 12.

FIG. 4C illustrates a cross-sectional view of a substrate during one-step formation of an EUV-active photoresist layer in accordance with an alternate embodiment.

As illustrated in FIG. 4C, the oxidation step may be combined with the steps of the formation of the metal alkoxide 12 (via supplying a metal precursor 10 and alcohol 11) and may be performed in a single step in a processing chamber, where the EUV-active photoresist layer 14 may be directly formed over the intermediate layer 110. This single step may be performed by a wet or dry process.

In various embodiments, after forming the EUV-active photoresist layer 14 over the substrate 100, an optional post-apply bake may be performed to remove any excess solvents from a wet process, residual volatile byproducts from a dry process, or both. As a result, the substrate 100 may be ready for a EUV lithography process for patterning.

FIGS. 5A-5C illustrate three example chemical structures of EUV-active photoresist 14 comprising tin alkoxides that may be formed by the methods described above in accordance with various embodiments.

The size of alkoxy group may be varied in various embodiments. In FIG. 5A, the EUV-active photoresist 14 is based on the ethoxide (—$OC_2H_5$) group as an example of a small-size alkoxy group. The use of relatively small-size alkoxy group may be useful in improving hydrophilicity of the EUV-active photoresist 14. On the other hand, the use of medium or large alkoxy group may improve hydrophobicity of the EUV-active photoresist 14 as well as providing steric hindrance to prevent excess condensation before a EUV lithography process. In FIG. 5B, the EUV-active photoresist 14 is based on the tert-butoxide (—$OC_4H_9$) group as an example of a medium-size alkoxy group. In FIG. 5C, the EUV-active photoresist 14 is based on the cyclohexyl alkoxide (—$OC_6H_{11}$) group as an example of a large-size alkoxy group.

Figure 6A:
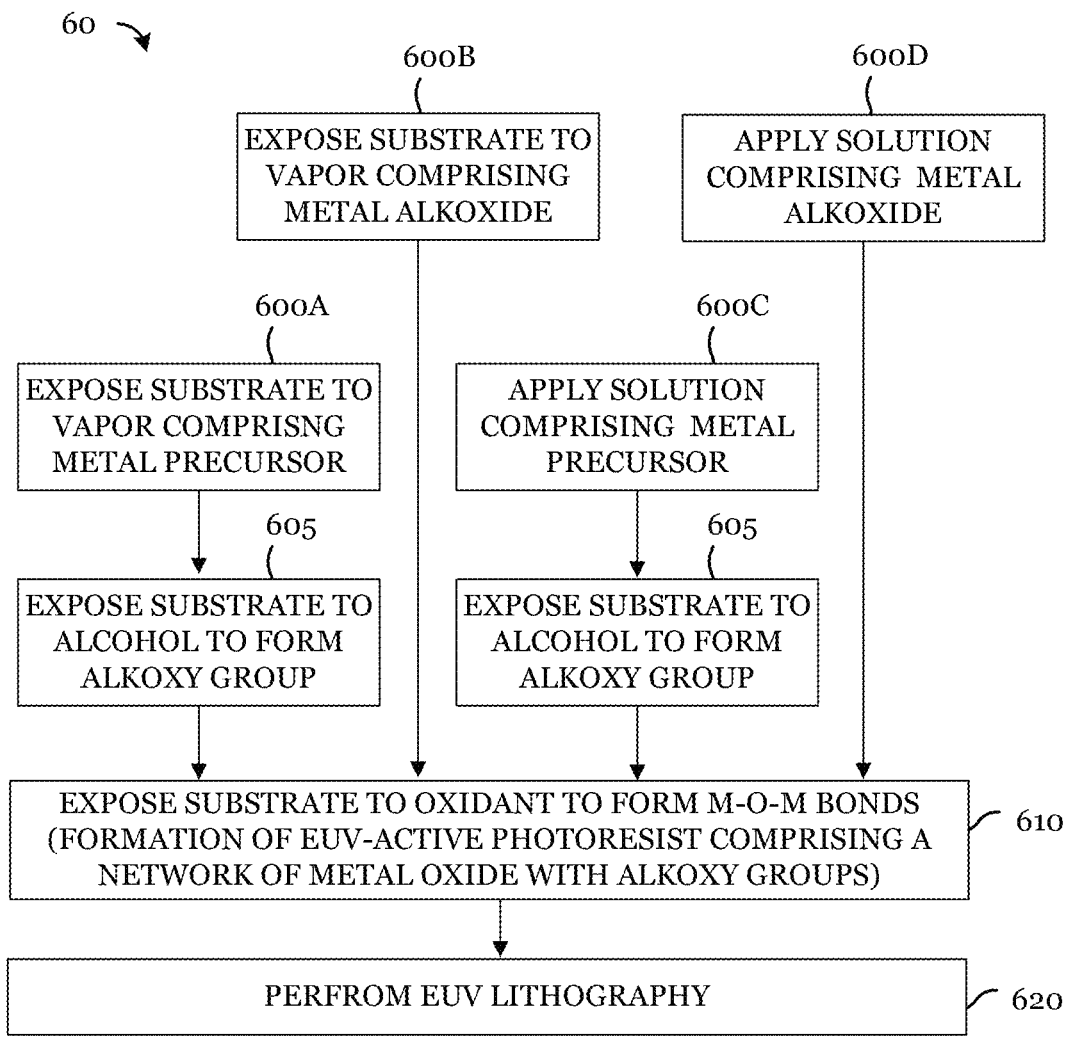
Figure 6B:
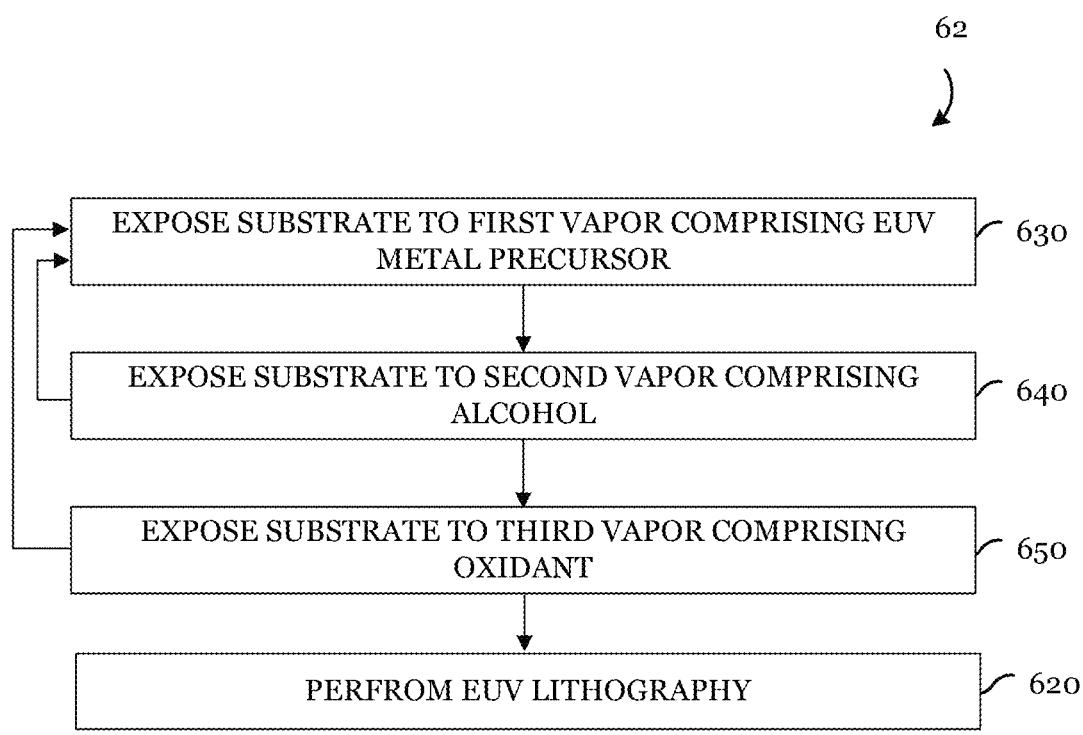
FIG. 6B illustrates the substrate at a subsequent step of reacting the deposited tin precursor with alcohol to form the tin alkoxide.

FIGS. 6A and 6B illustrate process flow charts of methods of formation of a EUV-active photoresist layer in accordance with various embodiments. The process flow can be followed with the figures discussed above (e.g., FIGS. 2A-2D and 4A-4B) and hence will not be described in detail again.

In FIG. 6A, a process flow 60 may start with the formation of a metal alkoxide by exposing a substrate 100 to a vapor comprising a metal precursor (block 600A, e.g., FIG. 2A) and then exposing the substrate 100 to an alcohol to form a metal alkoxide (block 605, e.g., FIG. 2B). Alternately, a solution comprising the metal precursor dissolved in a solvent may be applied by a spin-on process (block 600C, e.g., FIG. 2A) and then the substrate 100 is exposed to an alcohol to form a metal alkoxide (block 605, e.g., FIG. 2B). The spin-on process may comprise heating the substrate 100 to remove the solvent used in the process. In either embodiment, after forming the metal alkoxide, the substrate 100 may be exposed to an oxidant to form metal-oxygen-metal bonds (block 610, e.g., FIG. 4A). Once this step is complete, the EUV-active photoresist comprising the network of metal oxide terminated with alkoxy groups is formed over the substrate 100, and a EUV lithography process may be performed (block 620). Yet in other embodiments where the metal alkoxide is already available (e.g., FIG. 2D), the process flow 60 may start with exposing the substrate to a vapor comprising the metal alkoxide (block 600B) or applying a solution comprising the metal alkoxide (block 600D), followed by the oxidation (block 610) and the EUV lithography process (block 620) to pattern the EUV-active photoresist.

In FIG. 6B, a process flow 62 may comprise a cyclic dry process, for example based on atomic layer deposition (ALD). First, a substrate 100 may be exposed to a first vapor comprising a EUV metal precursor 10 (block 630, e.g., FIG. 2A). Next, the substrate 100 may be exposed to a second vapor comprising alcohol 11 (block 640, e.g., FIG. 2B) to form a layer of a metal alkoxide 12. These two steps may be repeated by alternating the two exposures to form layers of the metal alkoxide 12. In one embodiment, the two exposures may be alternated with an overlap in time, while in other embodiments, they may be separated with a purge step. The substrate 100 may then be exposed to a third vapor comprising an oxidant 13 (block 650, e.g., FIG. 4A) to form metal-oxygen-metal bonds. These three steps (blocks 630, 640, and 650) may also be repeated to obtain a target thickness for the EUV-active photoresist 14. After completing the formation of the EUV-active photoresist 14, an EUV lithography process may be performed (block 620) to pattern the EUV-active photoresist 14.

In the following, an extreme ultraviolet (EUV) lithography process to pattern an EUV-active photoresist is described in accordance with various embodiments.

Figure 7:
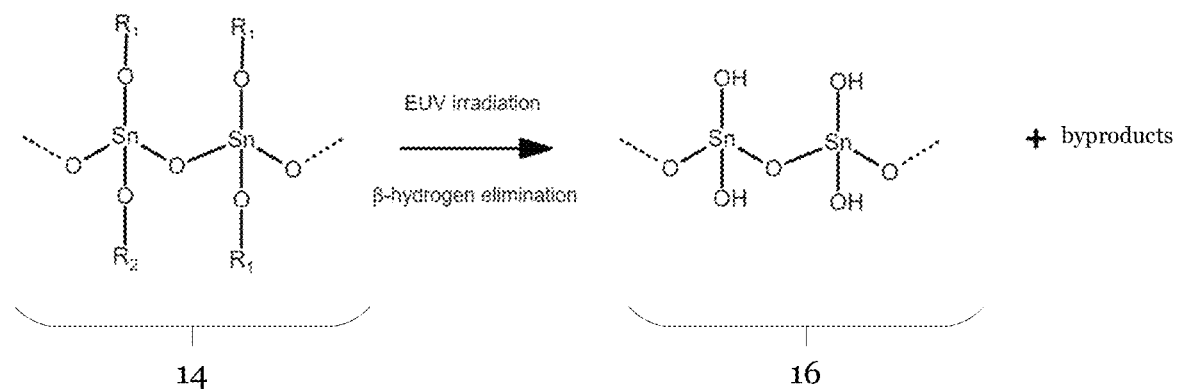
FIG. 7 illustrates a potential reaction occurring during an EUV irradiation step in a EUV lithography process where the alkoxy groups of an EUV-active photoresist are converted to hydroxy groups by β-hydrogen elimination in accordance with various embodiments.

FIG. 7 illustrates a potential reaction occurring during an EUV irradiation step in a EUV lithography process in accordance with various embodiments.

In FIG. 7, the EUV irradiation induces β-hydrogen elimination, where the alkoxy groups of an EUV-active photoresist 14 are converted to hydroxy groups in a reacted photoresist 16 and alkenes may be formed as byproducts. Although not wishing to be limited by any theory, at this stage, some of the formed hydroxy groups may further be condensed by dehydration to crosslink to form additional metal-oxygen-metal bonds. As a result of the structural change of the EUV-active photoresist 14 into the reacted photoresist 16, material properties such as solubility may be affected, giving origin to the tonality as a photoresist.

Figure 8A:
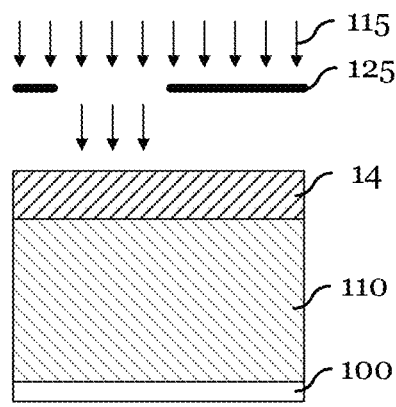
Figure 8B:
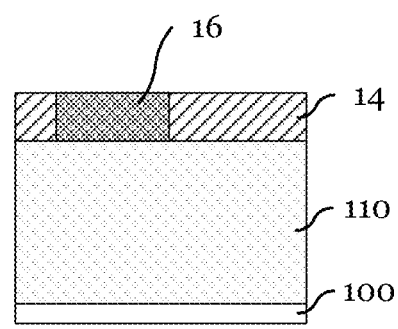

FIGS. 8A and 8B illustrate cross-sectional views of a substrate 100 at an EUV irradiation step in a EUV lithography process in accordance with various embodiments.

In FIG. 8A, a layer of a EUV-active photoresist 14 is formed over an intermediate layer 110 on the substrate 100. The EUV lithography process may be performed by exposing the substrate 100 to an EUV irradiation 115 (e.g., at a wavelength of 13.5 nm) through a photomask 125. Accordingly, the photo-induced reaction described in FIG. 7 occurs only in regions of the EUV-active photoresist 14 exposed to the EUV irradiation 115.

In FIG. 8B, the substrate 100 after the EUV irradiation step is illustrated. The regions of the EUV-active photoresist 14 exposed to the EUV irradiation 115 is converted to the reacted photoresist 16. Regions of the EUV-active photoresist 14 not exposed to the EUV irradiation 115 remain unreacted.

Figure 9:
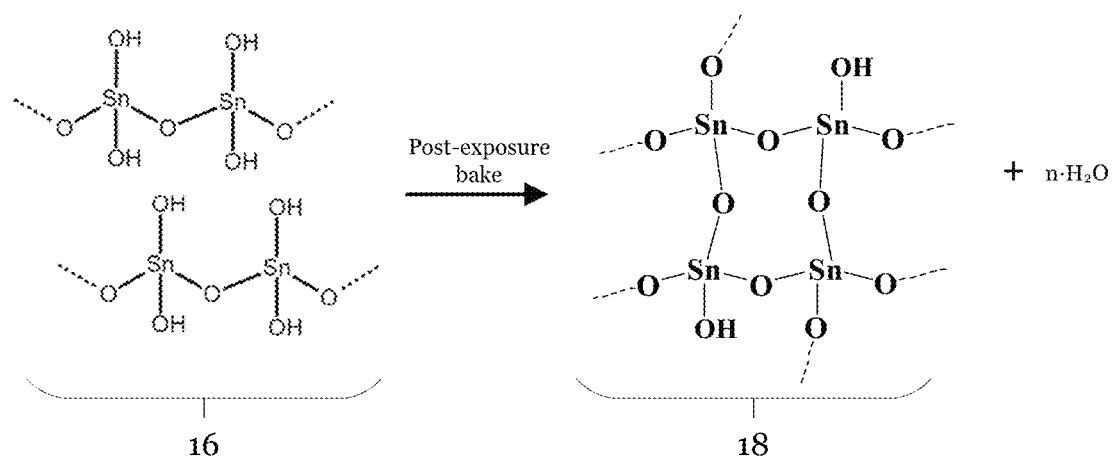
FIG. 9 illustrates a potential reaction occurring during an optional post-exposure bake (PEB) where the hydroxy groups of reacted EUV-active photoresist are condensed to release water molecules.

FIG. 9 illustrates a potential reaction occurring within the reacted photoresist 16 during an optional post-exposure bake (PEB).

Figure 10:
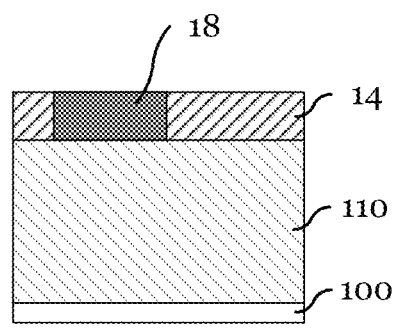
FIG. 10 illustrates a cross-sectional view of a substrate after an EUV irradiation step and a PEB.

FIG. 10 illustrates a cross-sectional view of a substrate 100 after an EUV irradiation step and the PEB illustrated in FIG. 9.

In various embodiments, the PEB may optionally be performed to further differentiate the material properties of the reacted photoresist 16 from those of unreacted EUV-active photoresist. In certain embodiments, the PEB may be performed by heating the substrate 100 in a processing chamber at a temperature between 70° C. to 250° C., for example between 180° C. to 225° C. in one embodiment, in vacuum or under a gas flow.

Although not wishing to be limited by any theory, upon performing the PEB, as illustrates in FIG. 9, the hydroxy groups of the reacted photoresist 16 are condensed to release water molecules. This reaction increases crosslinking within the network of metal oxide, i.e., forming additional metal-oxygen-metal bonds. As a result, a baked photoresist 18 (FIGS. 9 and 10) becomes a further condensed network of metal oxide terminated with hydroxy groups. The baked photoresist 18 may have material properties different from both the initial network of metal oxide terminated with alkoxy groups (e.g., unreacted regions of the EUV-active photoresist 14 in FIG. 10) and the reacted photoresist (e.g., the reacted photoresist 16 in FIG. 8B). For example, in various embodiments, the baked photoresist 18 may have a solubility substantially lower than that of the EUV-active photoresist 14. In various embodiments, the solubility of baked photoresist 18 may be lower than the solubility of the EUV-active photoresist 14 by about 1.5 times to about 5 times, or between 2 times to 10 times in another embodiment. Further, the volatility may also be lowered, for example by about a factor of 2 in one embodiment. Consequently, the baked photoresist 18 may be more resistant to a dry developing process such as a dry etch (e.g., reactive ion etching or atomic layer etching) compared to the EUV-active photoresist 14. For instance, the sputter threshold may be higher for the baked photoresist 18.

Figure 11A:
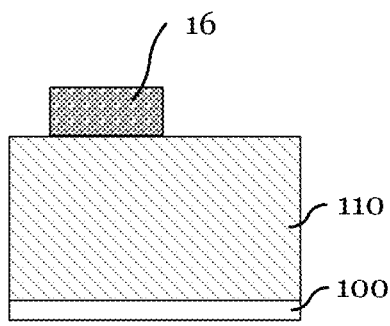
Figure 11B:
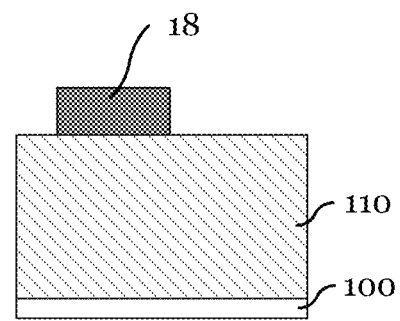

FIGS. 11A and 11B illustrate cross sectional views of a substrate 100 after a developing step in accordance with various embodiments.

After completing the EUV exposure and the optional post-exposure bake (PEB), the developing step may be performed to remove a portion of the EUV-active photoresist 14 for patterning. The developing step may be a wet or dry process. Conventionally, a photoresist may be removed by treating the substrate with a developing solution to dissolve the reacted (in case of a positive tone resist) or unreacted (in case of a negative tone resist) regions of the photoresist. A similar wet process may be applied in various embodiments. Alternately, a dry process may be used in other embodiments. The dry process may comprise, for example, a selective plasma etch process or a thermal process, advantageously eliminating the use of a developing solution. In certain embodiments, the dry process may be performing using reactive ion etching (RIE) process or atomic layer etching (ALE).

In FIGS. 11A and 11B, the unreacted regions of the EUV-active photoresist are removed, illustrating a case of a negative photoresist. The reacted photoresist 16 (FIG. 11A) or the baked photoresist 18 (FIG. 11B) may be left as a feature over the intermediate layer 110. This feature may be further used as an etch mask to transfer the pattern to the intermediate layer 110. In other embodiments, the EUV-active photoresist may be a positive tone resist, where the reacted regions (the reacted photoresist 16 or the baked photoresist 18) may be selectively removed by the developing step. In certain embodiments for the positive photoresists, a chemical modification step may be performed to alter the chemical structure of the reacted photoresist 16 or the baked photoresist 18 to reverse the tone of the photoresist. In one embodiment, such a positive-tone photoresist may comprise a cross-linked metal-alkoxide containing film that undergoes chain scission during EUV exposure.

Figure 12A:
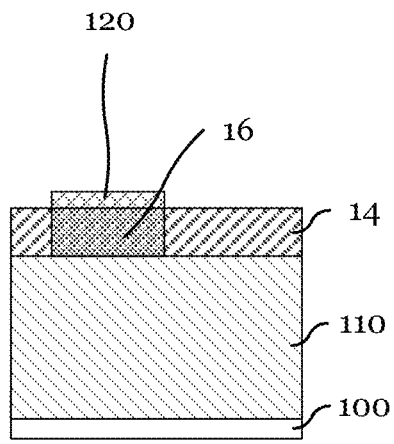
Figure 12B:
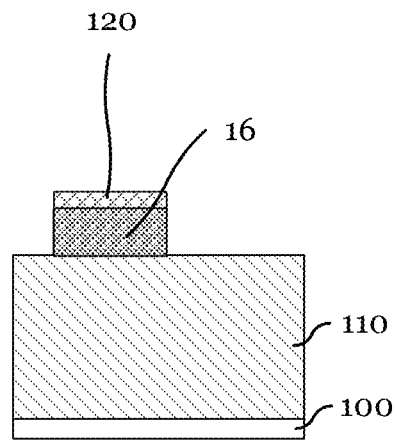
Figure 12C:
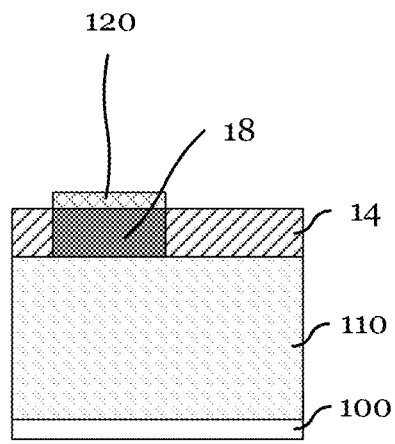

FIGS. 12A and 12C illustrate cross-sectional views of a substrate 100 at a post-exposure deposition step of a EUV lithography process in accordance with various embodiments.

Figure 12D:
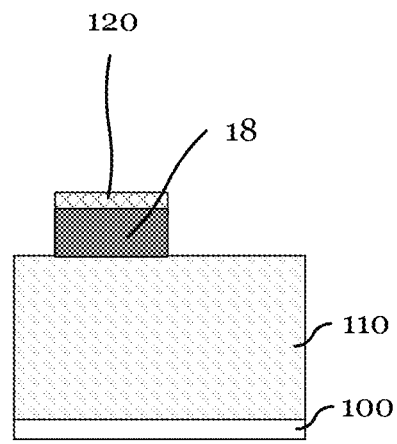

FIGS. 12B and 12D illustrate cross-sectional views of a substrate 100 after a developing step after the post-exposure deposition step in accordance with various embodiments, corresponding to FIGS. 12A and 12C, respectively.

In some embodiments, after the EUV exposure and before the developing step, an area-selective post-exposure deposition step may optionally be inserted to form a material layer 120 selectively over the reacted regions of the EUV-photoresist. The material layer 120 may be formed over the reacted photoresist 16 (FIG. 12A) or the baked photoresist 18 (FIG. 12C). For example, this material layer may be used as a hardmask to improve selectivity in the developing step and/or subsequent processes such as a plasma etch process to form a feature in the intermediate layer 110. In certain embodiments, the post-exposure deposition step may be based on atomic layer deposition (ALD). Surface functional groups of the reacted regions of the EUV-photoresist such as hydroxy groups may be used to chemically adsorb a reactant from a vapor used in the post-exposure deposition step. Other deposition techniques may also be used for the post-exposure deposition step. For example, such techniques may comprise chemical vapor deposition (CVD), physical vapor deposition (PVD), as well as other plasma processes such as plasma enhanced CVD (PECVD). Alternately, a wet process may be used for the post-exposure deposition step. The developing step may be performed after the post-exposure deposition step (FIGS. 12B and 12D).

Figure 13:
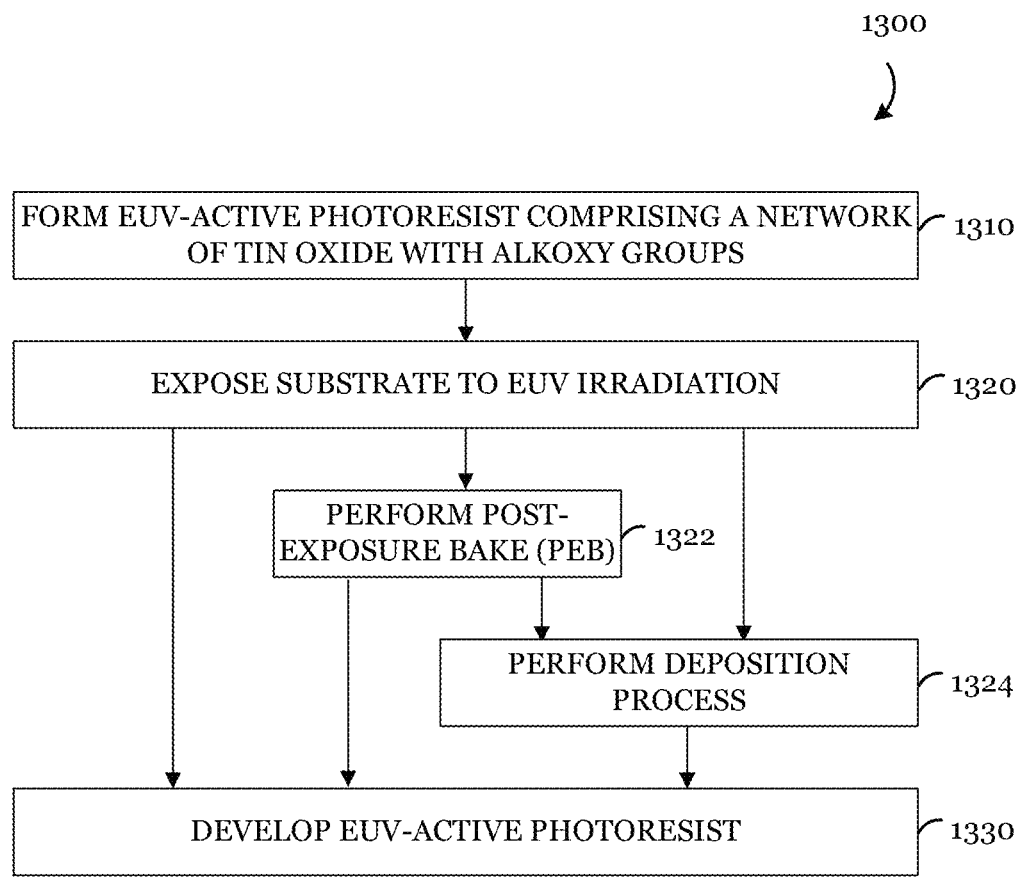
FIG. 13 illustrate a process flow chart of methods of EUV lithography process in accordance with various embodiments.

FIG. 13 illustrate a process flow chart of methods of EUV lithography process in accordance with various embodiments. The process flow can be followed with the figures discussed above (e.g., FIGS. 8A-8B, 10, 11A-11B, and 12A-12D) and hence will not be described in detail again.

In FIG. 13, a process flow 1300 may start with forming an EUV-active photoresist comprising tin alkoxide on a substrate (block 1310), followed by exposing the substrate to a patterned EUV irradiation (block 1320). Next, a developing step may be formed immediately (block 1330) in certain embodiments. Alternately, after the EUV exposure (block 1320) and before the developing step (block 1330), a post-exposure bake (PEB) may be performed (block 1322). In yet other embodiments, after the EUV exposure (block 1320), a post-exposure deposition step to form a material layer may be performed (block 1324), followed by the developing step (block 1330). In yet another embodiment, after the EUV exposure (block 1320), the PEB and the post-exposure deposition step may be performed (blocks 1322 and 1324), followed by the developing step (block 1330). The order of these two optional steps may be switched and the post-exposure deposition step (block 1324) may be performed before the PEB (block 1322).

Example embodiments of the invention are summarized here. Other embodiments can also be understood from the entirety of the specification as well as the claims filed herein.

Example 1. A method of processing a substrate that includes forming over the substrate an extreme ultraviolet (EUV)-active photoresist film including a network of metal oxide terminated with alkoxy groups, and patterning the EUV-active photoresist film with EUV lithography.

Example 2. The method of example 1, where one or more of the alkoxy groups includes a hydrogen at a β position relative to oxygen.

Example 3. The method of one of examples 1 or 2, where the metal oxide is a tin oxide.

Example 4. The method of one of examples 1 to 3, where the alkoxy groups includes an ethoxide, an iso-propoxide, a tert-butoxide, a cyclohexyl alkoxide, a cyclohexene alkoxide, or a cyclohexadiene alkoxide.

Example 5. The method of one of examples 1 to 4, further including forming a metal compound terminated with one or more of the alkoxy groups from a metal precursor, the metal compound being an intermediate for forming the network, where forming the metal compound from the metal precursor includes: exposing the substrate to a vapor including the metal precursor; and exposing the metal precursor to an alcohol, and where forming the EUV-active photoresist film includes exposing the metal compound to the oxidant to form metal-oxygen-metal bonds by replacing one or more of the ligands of the metal compound.

Example 6. The method of one of examples 1 to 5, where forming the EUV-active photoresist film includes: depositing a layer including metal alkoxide over the substrate by exposing the substrate to a vapor including the metal alkoxide; and exposing the layer including metal alkoxide to an oxidant to form metal-oxygen-metal bonds by replacing one or more ligands of the metal alkoxide.

Example 7. The method of one of examples 1 to 6, where the oxidant includes oxygen, ozone, water, air, or hydrogen peroxide.

Example 8. The method of one of examples 1 to 7, where the vapor and the oxidant are introduced simultaneously into a processing chamber holding the substrate.

Example 9. The method of one of examples 1 to 8, where the forming includes: depositing, in a plasma processing chamber, a layer including metal alkoxide over the substrate by exposing the substrate to a vapor including the metal alkoxide; and oxidizing the layer including metal alkoxide by exposing to oxygen radicals generated within the plasma processing chamber to form the network of metal oxide.

Example 10. The method of one of examples 1 to 9, where patterning the EUV-active photoresist film includes: converting one or more of the alkoxy groups in the exposed EUV-active photoresist film to hydroxy groups; and converting the hydroxy groups to form additional metal-oxygen-metal bonds in the network of metal oxide.

Example 11. A method of processing a substrate in a plasma processing chamber, the method including: exposing the substrate in the plasma processing chamber to a first vapor including a EUV metal precursor; exposing the substrate in the plasma processing chamber to a second vapor including an alcohol having a hydrogen in a β-position relative to oxygen; forming a photoresist film including a EUV metal alkoxide over the substrate by exposing the substrate in the plasma processing chamber to a third vapor including an oxidant; and patterning the photoresist film with EUV lithography.

Example 12. The method of example 11, where the EUV metal is tin, where the exposing of the substrate to the first vapor includes chemically adsorbing the tin precursor onto the substrate, where the exposing of the substrate to the second vapor includes reacting the alcohol with the adsorbed tin precursor to form an tin alkoxy group, and where the exposing of the substrate to the third vapor includes oxidizing the adsorbed tin precursor to form a tin-oxide network including tin-oxygen-tin bonds.

Example 13. The method of one of examples 11 or 12, further including: alternating the exposing of the substrate to the first vapor and the exposing of the substrate to the second vapor more than once; and between the exposing of the substrate to the first vapor and the exposing of the substrate to the second vapor, performing a purge or degassing step to remove residual portions of the first vapor, the second vapor, or both.

Example 14. The method of one of examples 11 to 13, further including alternating the exposing of the substrate to the first vapor and the exposing of the substrate to the second vapor more than once, where the exposing of the substrate to the first vapor and the exposing of the substrate to the second vapor are overlapped in time.

Example 15. A method of extreme ultraviolet (EUV) lithography that includes: forming a EUV-active photoresist layer over a substrate, the EUV-active photoresist layer including a network of tin oxide terminated with alkoxy groups; exposing the substrate to a EUV irradiation having passed through an optical mask that includes patterns to form exposed regions of the EUV-active photoresist layer, one or more alkoxy groups in the exposed regions undergoing β-hydrogen elimination to form a tin hydroxide by eliminating an alkene; and developing the EUV-active photoresist layer.

Example 16. The method of example 15, further including, after exposing the substrate to the EUV irradiation, performing a post-exposure bake to form tin-oxygen-tin bonds by condensing hydroxy groups of the tin hydroxides.

Example 17. The method of one of examples 15 or 16, where developing the EUV-active photoresist layer removes unexposed regions of the EUV-active photoresist layer.

Example 18. The method of one of examples 15 to 17, where developing the EUV-active photoresist layer is performed by a wet process.

Example 19. The method of one of examples 15 to 18, where developing the EUV-active photoresist layer is performed by a dry process using a plasma process, a thermal process, or both.

Example 20. The method of one of examples 15 to 19, further including, before developing the EUV-active photoresist layer, performing an area selective deposition process to form a material layer selectively over the exposed regions of the EUV-active photoresist layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   forming a metal alkoxide by exposing a metal precursor to an alcohol, the metal alkoxide being an intermediate for forming a network of metal oxide, the metal precursor comprising an extreme ultraviolet (EUV) metal and ligands, each of the ligands comprising an alkoxy group, an amine, a carboxylate, or a halogen, the metal precursor not comprising a metal-carbon bond;
   forming over the substrate an EUV-active photoresist film comprising the network of metal oxide; and
   patterning the EUV-active photoresist film with EUV lithography.

2. The method of claim 1, wherein the metal oxide comprises an alkoxy group comprising a hydrogen at a β position relative to oxygen.

3. The method of claim 1, wherein the metal oxide is a tin oxide.

4. The method of claim 1, wherein the metal oxide comprises an ethoxide, an iso-propoxide, a tert-butoxide, a cyclohexyl alkoxide, a cyclohexene alkoxide, or a cyclohexadiene alkoxide.

5. The method of claim 1, wherein forming the metal alkoxide comprises:
   before exposing the metal precursor to the alcohol, exposing the substrate to a vapor comprising the metal precursor; and
   wherein forming the EUV-active photoresist film comprises
   exposing the metal alkoxide to an oxidant to form metal-oxygen-metal bonds by replacing one or more of the ligands of the metal alkoxide.

6. The method of claim 1, wherein forming the EUV-active photoresist film comprises:
   depositing a layer comprising metal alkoxide over the substrate by exposing the substrate to a vapor comprising the metal alkoxide; and
   exposing the layer comprising metal alkoxide to an oxidant to form metal-oxygen-metal bonds by replacing one or more ligands of the metal alkoxide.

7. The method of claim 6, wherein the oxidant comprises oxygen, ozone, water, air, or hydrogen peroxide.

8. The method of claim 6, wherein the vapor and the oxidant are introduced simultaneously into a processing chamber holding the substrate.

9. The method of claim 1, wherein the forming comprises:
   depositing, in a plasma processing chamber, a layer comprising metal alkoxide over the substrate by exposing the substrate to a vapor comprising the metal alkoxide; and
   oxidizing the layer comprising metal alkoxide by exposure to oxygen radicals generated within the plasma processing chamber to form the network of metal oxide.

10. The method of claim 1, wherein patterning the EUV-active photoresist film comprises:
    converting one or more of the alkoxy groups in the EUV-active photoresist film to hydroxy groups; and
    converting the hydroxy groups to form additional metal-oxygen-metal bonds in the network of metal oxide.

11. A method of processing a substrate in a plasma processing chamber, the method comprising:
    exposing the substrate in the plasma processing chamber to a first vapor comprising a metal precursor, the metal precursor comprising an extreme ultraviolet (EUV) metal and ligands, each of the ligands comprising an alkoxy group, an amine, a carboxylate, or a halogen, the metal precursor not comprising a metal-carbon bond;
    exposing the substrate in the plasma processing chamber to a second vapor comprising an alcohol having a hydrogen in a β-position relative to oxygen;
    forming a photoresist film comprising a metal alkoxide over the substrate by exposing the substrate in the plasma processing chamber to a third vapor comprising an oxidant; and
    oxidizing the photoresist film by exposure to oxygen radicals generated within the plasma processing chamber to form a network of metal oxide.

12. The method of claim 11, wherein the metal is tin, wherein the exposing of the substrate to the first vapor comprises chemically adsorbing the metal precursor onto the substrate, wherein the exposing of the substrate to the second vapor comprises reacting the alcohol with the adsorbed metal precursor to form a tin alkoxy group, and wherein the exposing of the substrate to the third vapor comprises oxidizing the adsorbed metal precursor to form a tin-oxide network comprising tin-oxygen-tin bonds.

13. The method of claim 11, further comprising:
    alternating the exposing of the substrate to the first vapor and the exposing of the substrate to the second vapor more than once; and
    between the exposing of the substrate to the first vapor and the exposing of the substrate to the second vapor, performing a purge or degassing step to remove residual portions of the first vapor, the second vapor, or both.

14. The method of claim 11, further comprising alternating the exposing of the substrate to the first vapor and the exposing of the substrate to the second vapor more than once, wherein the exposing of the substrate to the first vapor and the exposing of the substrate to the second vapor are overlapped in time.

15. A method of extreme ultraviolet (EUV) lithography, the method comprising:
    forming a tin alkoxide by exposing a tin precursor to an alcohol, the tin alkoxide being an intermediate for forming a network of tin oxide, the tin precursor comprising tin and ligands, each of the ligands comprising an alkoxy group, an amine, a carboxylate, or a halogen, the tin precursor not comprising a tin-carbon bond;
    forming an EUV-active photoresist layer over a substrate, the EUV-active photoresist layer comprising the network of tin oxide;
    exposing the substrate to an EUV irradiation having passed through an optical mask that comprises patterns to form exposed regions of the EUV-active photoresist layer, one or more alkoxy groups in the exposed regions undergoing β-hydrogen elimination to form a tin hydroxide by eliminating an alkene; and developing the EUV-active photoresist layer.

16. The method of claim 15, further comprising, after exposing the substrate to the EUV irradiation, performing a post-exposure bake to form tin-oxygen-tin bonds by condensing hydroxy groups of the tin hydroxides.

17. The method of claim 15, wherein developing the EUV-active photoresist layer removes unexposed regions of the EUV-active photoresist layer.

18. The method of claim 15, wherein developing the EUV-active photoresist layer is performed by a wet process.

19. The method of claim 15, wherein developing the EUV-active photoresist layer is performed by a dry process using a plasma process, a thermal process, or both.

20. The method of claim 15, further comprising, before developing the EUV-active photoresist layer, performing an area selective deposition process to form a material layer selectively over the exposed regions of the EUV-active photoresist layer.

* * * * *